(12) United States Patent
Chen et al.

(10) Patent No.: US 10,811,310 B2
(45) Date of Patent: Oct. 20, 2020

(54) METAL SPACER SELF ALIGNED DOUBLE PATTERNING WITH AIRGAP INTEGRATION

(71) Applicant: International Business Machines Corporation, Armonk, NY (US)

(72) Inventors: Hsueh-Chung Chen, Cohoes, NY (US); James Kelly, Schenectady, NY (US); Yann Mignot, Singerlands, NY (US); Cornelius Brown Peethala, Singerlands, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/176,598

(22) Filed: Oct. 31, 2018

(65) Prior Publication Data
US 2020/0135537 A1    Apr. 30, 2020

(51) Int. Cl.
*H01L 21/768* (2006.01)
*H01L 23/532* (2006.01)
*H01L 21/3213* (2006.01)

(52) U.S. Cl.
CPC .... *H01L 21/7682* (2013.01); *H01L 21/76834* (2013.01); *H01L 21/76885* (2013.01); *H01L 21/76897* (2013.01); *H01L 21/32134* (2013.01); *H01L 21/76877* (2013.01); *H01L 23/53228* (2013.01)

(58) Field of Classification Search
CPC .................................................. H01L 21/7682
See application file for complete search history.

(56) References Cited

U.S. PATENT DOCUMENTS

| | | |
|---|---|---|
| 6,228,763 B1 | 5/2001 | Lee |
| 6,352,917 B1 | 3/2002 | Gupta et al. |
| 6,689,283 B2 | 2/2004 | Hattori et al. |
| 8,782,586 B2 | 7/2014 | Sezginer et al. |
| 9,026,973 B2 | 5/2015 | Tien et al. |
| 9,640,424 B2 | 5/2017 | Ren et al. |
| 2011/0014786 A1 | 1/2011 | Sezginer et al. |
| 2012/0032344 A1* | 2/2012 | Usami ............... H01L 21/76807 257/774 |
| 2014/0264894 A1 | 9/2014 | Tien et al. |
| 2014/0273496 A1 | 9/2014 | Kao et al. |
| 2015/0380298 A1 | 12/2015 | Sato et al. |
| 2016/0211172 A1 | 7/2016 | Ren et al. |
| 2016/0314985 A1 | 10/2016 | Yang et al. |
| 2017/0294310 A1 | 10/2017 | Tapily et al. |

OTHER PUBLICATIONS

Chen, S. et al., "48nm pitch Cu Dual-Damascene Interconnects using Self Aligned Double Patterning Scheme", pp. 1-3.
(Continued)

*Primary Examiner* — William A Harriston
(74) *Attorney, Agent, or Firm* — Cantor Colburn LLP; James Nock

(57) ABSTRACT

A method and structure of forming air gaps with a sidewall image transfer process such as self-aligned double patterning to reduce capacitance and resistance. In these methods and structures, the spacer is a metal.

12 Claims, 2 Drawing Sheets

(56) References Cited

OTHER PUBLICATIONS

Kelly, J., et al., "Experimental Study of Nanoscale Co Damascene BEOL Interconnect Structures", 2016 IEEE, IBM Research at Albany Nanotech, Albany, NY USA, pp. 40-42.

Tagami, M. et al., 56nm-pitch Low-k/Cu Dual-Damascene Interconnects Integration with Multiple Exposure Patterning Scheme, Research Alliance Teams at various IBM Research and Development Facilities, pp. 1-2.

* cited by examiner

METAL SPACER SELF ALIGNED DOUBLE PATTERNING WITH AIRGAP INTEGRATION

BACKGROUND

This invention generally relates to integrated circuits and methods of fabrication. More particularly, the present invention relates to back end of the line (BEOL) interconnect structures and methods of forming airgaps between metal lines using a sidewall image transfer process such as a self-aligned double patterning (SADP) process.

Typical integrated circuits are formed by first fabricating individual semiconductor devices using processes referred to generally as the front end of line (FEOL). Thereafter, the individual devices on the integrated circuit are interconnected by forming the wiring of the wafer using processes referred to generally as the back end of line (BEOL). In the BEOL, the individual devices (transistors, capacitors, resistors, etc.) are interconnected with interconnects and a metallization layer, which function as the wiring network of the wafer. Common metals that are used to form the metallization layers and interconnects are copper, cobalt, tungsten, and aluminum. BEOL generally begins when the first layer of metal (M0) is deposited on the wafer. BEOL includes contacts, insulating layers (dielectrics), metal levels, and bonding sites for chip-to-package connections. Double patterning processes such as self-aligned double patterning (SADP) or litho-etch-litho etch (LELE) are typically part of the BEOL process for advanced design rules.

The main difference between the two approaches is that in LELE, the layout is divided between two masks, and the second mask is aligned with respect to the first during manufacturing, while SADP generates the pitch (mask) split using spacers that are self-aligned to the first litho-etch step. The second mask in an SADP process is a block or cut mask used to trim the tips of the lines created in the first step and/or remove dummy lines. As a result, the SADP approach produces less variation due to mask misalignment. There are two general SADP approaches: spacer is dielectric (SID) where the dielectric spacer would define the final dielectric between two metal lines and spacer is metal (SIM) which is an inversion of the former.

SUMMARY

Embodiments of the present invention are generally directed to semiconductor structures including back end of the line (BEOL) interconnect structures and methods for forming the semiconductor structures including formation of airgaps between metal lines. A non-limiting example of a method of forming an interconnect structure in accordance with one or more aspects of the present invention includes forming sidewall spacers on a plurality of mandrels that are overlying an intermetal dielectric layer, wherein the sidewall spacers include a metal and define metal lines. The plurality of mandrels are removed and a dielectric liner layer deposited forming one or more airgaps between at least one pair of adjacent sidewall spacers. An ultralow k dielectric layer is deposited and planarizes to form a top planar surface. The ultralow k dielectric is etched to form via openings self-aligned to one or more of the metal lines and filled with copper.

A non-limiting example of a sidewall image transfer method of forming an interconnect structure in accordance with one or more aspects of the present invention includes providing a mandrel pattern overlying a dielectric layer. A thin metal layer is conformally deposited onto the mandrel pattern and etched back to form metal spacers on sidewalls of the mandrel pattern. The mandrel pattern is removed to define a plurality of metal lines from the metal spacers. This approach is different from the conventional SID or SIM SADP integration because the spacer itself is a metal layer. A final metal pattern is lithographically defined from the plurality of metal lines. A dielectric layer is deposited forming a least one airgap between one or more adjacent metal lines. An ultra-low k dielectric layer is deposited and planarized. A single damascene process is applied to form a via opening self-aligned to one or more of the metal lines. The via opening is filled with a metal to form an electrical connection with the one or more metal lines.

A self-aligned double patterning (SADP) method of forming a back end of line (BEOL) interconnect structure in accordance with one or more aspects of the present invention includes forming a mandrel pattern including metal spacers on sidewalls thereof overlying a first dielectric layer. Pulling the mandrel pattern, wherein the metal spacers define metal lines at a pitch twice that of the mandrel pattern. Non-conformally depositing a dielectric liner to form an airgap between at least one or more adjacent metal lines, wherein the airgap is self-aligned. Depositing and planarizing a second dielectric layer to form a planar top surface. Depositing a non-conformal ultralow k dielectric into the openings, wherein the ultralow k dielectric pinches at a bottom portion and a top portion of the openings to form an airgap therein.

A self-aligned double patterning (SADP) method of forming a back end of line (BEOL) interconnect structure in accordance with one or more aspects of the present invention includes forming a plurality of cobalt lines on a first intermetal dielectric. The cobalt lines are lithographically cut to define a desired cobalt line pattern. A dielectric liner layer is non-conformally deposited onto the desired cobalt line pattern, wherein non-conformally depositing the dielectric liner layer forms an air gap between at least one pair of adjacent cobalt lines. A second intermetal dielectric layer is deposited and planarized. The second intermetal dielectric layer is etched to form one or more vias exposing a cobalt metal line. The one or more vias are filled with cobalt, wherein the one or more vias are electrically coupled to one or more of the cobalt metal lines.

A self-aligned double patterning (SADP) method of forming a back end of line (BEOL) interconnect structure in accordance with one or more aspects of the present invention includes forming a plurality of cobalt lines on a first intermetal dielectric. The cobalt lines are lithographically cut to define a desired cobalt line pattern. A dielectric liner layer is non-conformally deposited onto the desired cobalt line pattern, wherein non-conformally depositing the dielectric liner layer forms an air gap between at least one pair of adjacent cobalt lines. A second intermetal dielectric layer is deposited and planarized, wherein the second intermetal dielectric layer is an ultra-low k dielectric layer. The second intermetal dielectric layer is etched to form one or more vias exposing a cobalt metal line. The one or more vias are filled with copper, wherein the one or more vias are electrically coupled to one or more of the cobalt metal lines.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
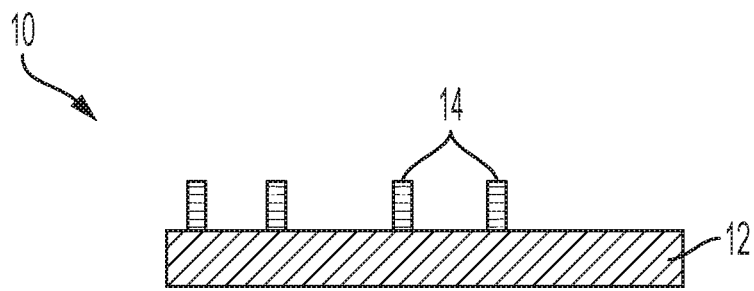
FIG. 1 is a cross-sectional view depicting a semiconductor structure at an intermediate stage of manufacturing for advanced design rules in accordance with an embodiment of the present invention.

It will be appreciated that for simplicity and clarity of illustration, elements shown in the drawings have not necessarily been drawn to scale. For example, the dimensions of some of the elements can be exaggerated relative to other elements for purpose of clarity.

DETAILED DESCRIPTION

Integrated circuits typically have interconnect levels, each level consisting of metallic lines and vias that are often formed using damascene process (via plus next level conductor). The metallic lines and vias are of the same or different conductive material. The conductive materials can be copper, but can be any suitable conductor including, but not limited to Cu, Co, Al, AlCu, Ti, TiN, Ta, TaN, W, WN, MoN, Pt, Pd, Os, Ru, IrO$_2$, ReO$_2$, ReO$_3$, alloys thereof, and mixtures thereof. Alloys based on copper with an additive metal (such as Ti or Sn) can also be used.

As dimensions such as metal line pitch within an interconnect level continue to shrink along with front end of line (FEOL) pitch, the spaces between metal lines also become limited. For the 7 nm technology node, patterning requirements include a metal pitch of 40 nm or less. This narrow pitch requirement forces the use of spacer based pitch multiplication techniques. Moreover, an ultra-low k material or airgap is needed to provide lower capacitance between the tightly pitched metal lines. The present invention is generally directed to methods and structures of forming these airgaps during back end of line (BEOL) processing using a self-aligned double patterning (SADP) spacer based pitch multiplication technique to provide the desired pitch and features sizes.

A basic SADP process is one of the techniques for processing metal layers at the 10 nanometers (nm) technology node and below. SADP uses a deposition and etch step process to create spacers surrounding a patterned shape. As understood by one skilled in the art, there are two masking steps: the first mask is called the mandrel mask and the second mask is called the block mask. These masks are quite different from the masks normally utilized in single-patterning or litho-etch-litho-etch (LELE) double patterning processes. Because spacer material is deposited on each side of the mandrel pattern, two shapes are created for every one shape originally defined, essentially pitch splitting the original lines (e.g., two mandrel mask shapes produce four spacers at half the pitch). In the metal process application of the present invention, the spacers define the gaps that will become airgaps between the trenches filled with a metal conductor to form the interconnect wires.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Moreover, numerous specific details are set forth in the following description, such as particular structures, components, materials, dimensions, processing steps and techniques, in order to provide a thorough understanding of the present invention. However, it will be appreciated by one of ordinary skill in the art that the present invention can be practiced without these specific details. In other instances, well-known structures or processing steps have not been described in detail in order to avoid obscuring the present invention. Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, back end of line (BEOL) processes are generally focused on forming metal interconnects between the different devices of the integrated circuit whereas the fabrication of the different devices that make up the integrated circuit are generally done during the front end of line (FEOL) processing.

Exemplary applications/uses to which the present invention can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), and complex (e.g., VLSI, VLSI, etc.) application specific integrated circuits (ASICS) and processors.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

It should also be noted that certain features may or may not be shown in all figures for the sake of clarity. This is not intended to be interpreted as a limitation of any particular embodiment, or illustration, or scope of the claims.

SADP generates the pitch (mask) split using spacers that are self-aligned to the first litho-etch step. The second mask in an SADP process is a block or cut mask used to trim the tips of the lines created in the first step and/or remove dummy lines. As a result, the SADP approach produces less variation due to mask misalignment (FIG. 1).

Referring now to the drawings in which like numerals represent the same or similar elements and initially to FIG. 1, a cross sectional view of a semiconductor structure 10 at an intermediate stage of manufacturing an interconnect level for advanced design rules is generally shown, in accordance with an embodiment of the present invention. The semiconductor structure 10 includes an interlayer dielectric layer (ILD) 12 having a planarized upper surface, an optional hardmask layer (not shown) on the planar upper surface, and an amorphous silicon (aSi) mandrel pattern 14 overlying the ILD 12, all of which typically overlay a variety of front end of line devices formed on a substrate (not shown). As will be described in greater detail, the interconnect level formed during a BEOL process includes metal lines at a relatively tight pitch formed in the ultralow k dielectric layer 12. The depicted interconnect level is not intended to be limited and is generally shown to illustrate the versatility in forming metal lines at a tight pitch with airgaps therebetween to further reduce capacitance and to illustrate structural stability when defining line ends within a metal line, which can be problematic when using ultralow k dielectrics and relatively small feature sizes.

The ILD 12 can include any dielectric material including inorganic dielectrics or organic dielectrics. The dielectric material can be porous or non-porous. Some examples of suitable dielectric materials include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD 12 can be deposited by PECVD procedures as is generally known in the art. These patterned features correspond to the subsequent interconnect vias (i.e., metal plugs between levels) and can be aligned with underlying source and/or drain regions or over a metal gate structure defined by the particular substrate (not shown). The thickness of the ILD generally ranges from 50 nm to 70 nm, although lesser and greater thicknesses can also be employed.

The optional hardmask layer can be metal oxide or nitride deposited at lower temperature (e.g., less than 400° C.), such as a Ti-based or Al-based or Ta-based metal oxide or nitride/oxynitride, and the like. In one or more embodiments, multiple layers can be used to define the optional hardmask layer.

Figure 2:
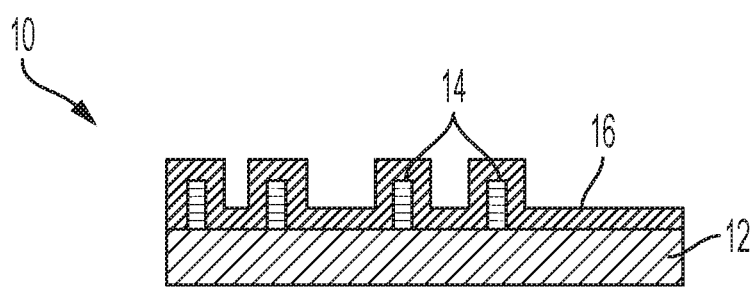
FIG. 2 depicts a cross sectional view of the semiconductor structure of FIG. 1 subsequent to spacer is metal deposition in accordance with an embodiment of the present invention.

FIG. 2 depicts a cross sectional view of the semiconductor structure 10 of FIG. 1 subsequent to conformal deposition of a metal layer 16. The metal layer 16 can be deposited by plasma vapor deposition, atomic layer deposition, or chemical vapor. As will be described in greater detail below, the metal layer will define the spacer such that the spacer is metal (SIM). Moreover, because a conformal layer of metal is deposited onto the mandrel pattern, consistent metal critical dimensions can be obtained. Exemplary metals include, without limitation, cobalt, ruthenium, tantalum, tungsten, aluminum, rhodium, platinum, nickel, silver gold, or combinations thereof.

Figure 3:
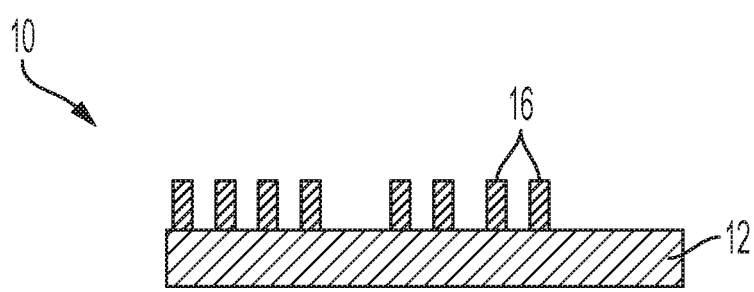
FIG. 3 depicts a cross sectional view of the semiconductor structure of FIG. 2 subsequent to spacer etch back and mandrel pullout in accordance with an embodiment of the present invention.

FIG. 3 depicts a cross sectional view of the semiconductor structure 10 of FIG. 2 subsequent to spacer etch back and mandrel pull out. Spacer etch back can include subjecting the structure to a directional etch process such as reactive ion etch. The directional etch process is selective to the mandrel 14, which removes the cobalt metal layer from the horizontal surfaces and exposes the ILD 12, and the top surface of the mandrel 14. The mandrel 14 is then pulled using an etching process using a et etch process or a dry etch process. For example, a wet etch process can include exposing the substrate to hot phosphoric acid selective the ILD 12.

Figure 4:
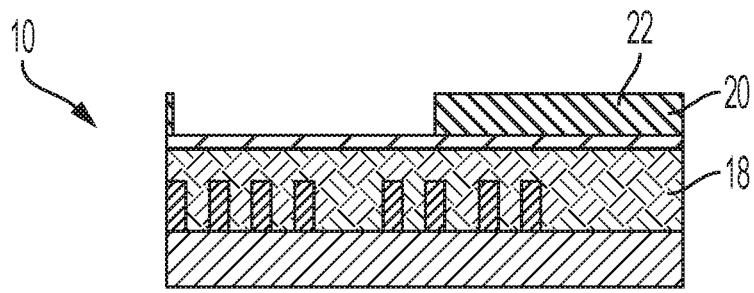
FIG. 4 depicts a cross sectional view of the semiconductor structure of FIG. 3 subsequent to cut lithography and patterning to define a final metal pattern in accordance with an embodiment of the present invention.

FIG. 4 depicts a cross sectional view of the semiconductor structure 10 of FIG. 3 subsequent to cut lithography and patterning to define the final metal pattern. Photolithography can include depositing a trilayer including an organic planarizing layer (OPL) 18, a silicon containing hardmask 20, and a photoresist 22 onto the structure and forming openings where desired by exposing the photoresist to a pattern of activating radiation, and then developing the exposed photoresist with a resist developer to provide a patterned photoresist. At least one highly selective etch process can then be employed to transfer the pattern from the patterned photoresist into the hardmask. The reduction in photoresist thickness as the devices scale to smaller dimensions make the photoresist no longer of capable of acting as a mask for transfer into the substrate. Consequently, the etch selectivity can be similar to that of the silicon containing hardmask layer, which generally results in significant photoresist loss and profile degradation. The pattern in the silicon containing hardmask layer 20 is transferred into the organic underlayer 18 utilizing a wet etch process or an oxygen reactive ion etch process. After transferring the pattern, the trilayer is removed utilizing resist stripping processes, for example, ashing.

The photoresist layer 22 can include a carbon backbone polymer and include other suitable components such as a solvent and/or photoacid generators. For example, the photoresist can be a chemical amplified resist known in the art. In one or more embodiments, the photoresist layer includes a photoacid generator distributed in the photoresist layer. When absorbing radiation energy from an exposure process, the photoacid generator forms a small amount of acid. The resist can include a polymer material that varies its solubility to a developer when the polymer is reacted with this generated acid.

The silicon-containing hardmask 20 overlaying the organic planarizing layer 18 can be silicon, silicon nitride, silicon carbide, silicon oxide, nitrided silicon carbide, silicon oxynitride, or the like. The silicon-containing hardmask 20 protects the organic underlayer 18 during RIE processing and has an etch selectivity different than underlayer. In one or more embodiments, the silicon containing hardmask is a silicon containing bottom anti-reflective coating ("SiBARC"). Incorporating silicon into the bottom anti-reflective coating results in an anti-reflective coating that provides reflection control but also can function as an etch transfer mask, i.e., a hard mask.

The OPL 18 can be a polymer including carbon, hydrogen, oxygen, and optionally nitrogen, fluorine, and silicon. In one or more embodiments, the planarization layer 30 is a polymer with sufficiently low viscosity so that the top surface of the applied polymer forms a planar top surface. In one or more other embodiments, the organic planarizing layer is a layer of material capable of being planarized by known chemical mechanical planarization processes. The organic planarization layer, which can be a spin-deposited layer, can be baked at an elevated temperature to cure the planarization layer, if needed, and reflow its top surface into a substantially planar form. The thickness of the planarization layer can be about 50 nanometers to about 300 nanometers (nm), although lesser and greater thicknesses can also be employed. Exemplary OPL materials include, without limitation, crosslinked polyhydroxystyrene, crosslinked polyacrylate(methycrylate) including cyclic alkyl groups, crosslinked polyacrylate(methacrylate) including fluorinated alkyl groups or aryl groups or both.

Figure 5:
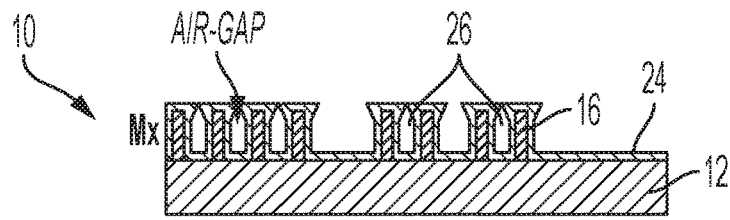
FIG. 5 depicts a top down view and cross sectional view of the semiconductor structure of FIG. 4 subsequent to dielectric liner deposition and self-aligned air gap formation in accordance with an embodiment of the present invention.

FIG. 5 depicts a cross sectional view of the semiconductor structure 10 of FIG. 4 subsequent to non-conformal dielectric liner deposition 24. A self-aligned air gap 26 is formed at tighter pitched cobalt lines as shown. Non-conformal deposition of the dielectric liner results in pinch off and formation of the airgap therein. As such, the resulting structure provides a dielectric including airgaps therein between tightly pitched metal lines 16.

Figure 6:
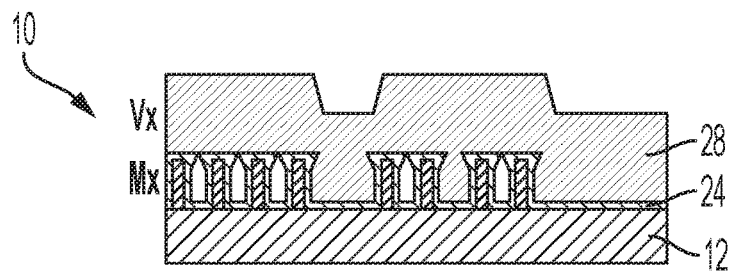
FIG. 6 depicts a top down view and cross sectional view of the semiconductor structure of FIG. 5 subsequent to deposition of a dielectric layer in accordance with an embodiment of the present invention.

FIG. 6 depicts a cross sectional view of the semiconductor structure 10 of FIG. 5 subsequent to deposition of an ultra-low k dielectric layer 28. The ultralow k dielectric layer 28 generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nanofoams, silica xerogels, porous hydrogen silsesquioxane (HSQ), porous methylsilsesquioxane (MSQ), porous inorganic materials, porous CVD materials, porous organic materials, or combinations thereof. The ultralow k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide(s) such as tetraethoxysilane (TEOS).

Figure 7:
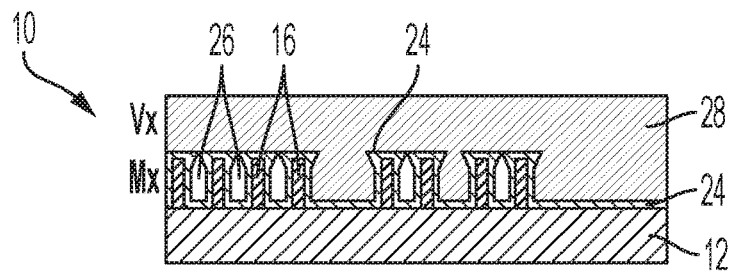
FIG. 7 depicts a top down view and a cross sectional view of the semiconductor structure of FIG. 6 subsequent to planarization of the dielectric layer in accordance with an embodiment of the present invention.

FIG. 7 depicts a cross sectional view of the semiconductor structure 10 of FIG. 6 subsequent to planarization of the dielectric layer 28 so as to provide a top planar surface. Planarization can include chemical-mechanical-polishing (CMP) to form the planar surface. The CMP process utilizes a non-selective slurry composition that typically contains a silica abrasive material.

Figure 8:
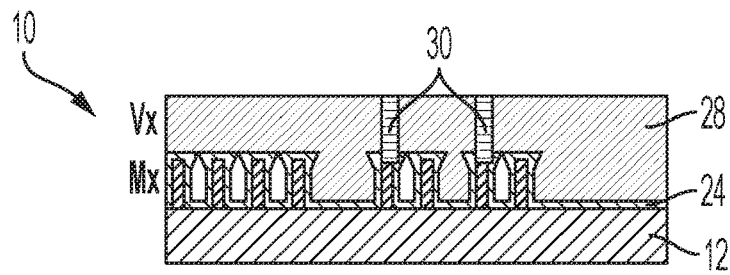
FIG. 8 depicts a top down view and a cross sectional view of the semiconductor structure of FIG. 7 subsequent to via formation in accordance with an embodiment of the present invention.

FIG. 8 depicts a cross sectional view of the semiconductor structure 10 of FIG. 7 subsequent to copper via formation to the cobalt metal lines 16 using a single damascene process. A photoresist can first be applied, and lithographically patterned to form openings corresponding to the vias. The openings are then directionally etched through the ultra-low k dielectric layer 28 and through the dielectric liner layer 24 so as to expose a surface of the cobalt metal line 16.

A liner layer i.e., diffusion barrier layer, (not shown) is conformally deposited onto the structure 10. For example, tantalum, tantalum nitride, cobalt, ruthenium, titanium, titanium nitride, tungsten nitride, and combinations of more than one material (for example tantalum nitride/tantalum or tantalum nitride/cobalt). The presence of the liner layer such as titanium nitride, for example, insures that a metal such as copper, which can participate in interdiffusion during subsequent annealing processes, will not further diffuse into the ultralow k dielectric 28. The liner layer can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of copper metal is then deposited to fill the vias 30. The copper can be deposited by CVD, sputtering, electrochemical deposition or like processes. For example, the deposition of copper can proceed by electrochemical deposition such as electroplating or electroless plating. In some structures, the copper metal layer can include an alloying element such as C, N, O, Cl or S, which have been shown to improve the reliability of the copper conductor. The amount of alloying element in the copper alloy is typically in the range of about 0.001 weight percent (wt. %) to about 10 wt %).

Following formation of the copper metal filled vias 30, the substrate is again subjected to a planarization process to remove any metal overburden (includes the seed layer, and liner layer removal). For example, the surface can be planarized using an electropolishing process. In an electropolishing process, small amounts of metal are etched by electroetch or electrochemical etching to provide the metal filled via 30 with a top surface generally coplanar to the top surface of the dielectric. Such a structure is often referred to as a recessed structure. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer.

Figure 9:
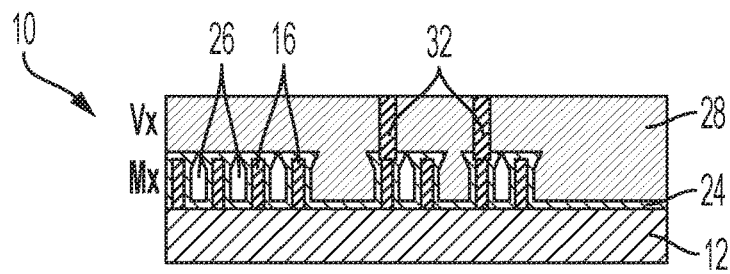
FIG. 9 depicts a top down view and a cross sectional view taken along lines A-A of the top down view of the semiconductor structure of FIG. 7 subsequent to via formation in accordance with an embodiment of the present invention.

FIG. 9 depicts a cross sectional view of the semiconductor structure 10 of FIG. 7 subsequent to formation of cobalt filled vias 32 to the cobalt metal lines 16 using a single damascene process as generally described above.

While the present invention has been particularly shown and described with respect to preferred embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A method of forming an interconnect structure, the method comprising:
    forming sidewall spacers on a plurality of mandrels that are overlying an intermetal dielectric layer, wherein the sidewall spacers comprise a metal and define metal lines, wherein the plurality of mandrels comprises amorphous silicon;
    removing the plurality of mandrels;
    depositing a dielectric liner layer;
    depositing an ultra-low k dielectric layer and forming one or more airgaps between at least one pair of adjacent sidewall spacers;
    planarizing the ultralow k dielectric layer to form a top planar surface;
    etching the ultralow k dielectric to form via openings self-aligned to one or more of the metal lines; and
    filling the via openings with copper.

2. The method of claim 1, wherein removing the plurality of mandrels comprises a wet etch process.

3. The method of claim 1, wherein the sidewall spacers comprise cobalt, ruthenium, tantalum, tungsten, aluminum, rhodium, platinum, nickel, silver, gold, or combinations thereof.

4. The method of claim 1, wherein forming the sidewall spacers on the plurality of mandrels comprises a self-aligned double patterning process.

5. The method of claim 1, wherein the ultra-low k dielectric has a k constant of less than 3.0.

6. The method of claim 1, wherein the ultra-low k dielectric comprises porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof.

7. The method of claim 1, wherein the metal lines comprise cobalt.

8. A method of forming an interconnect structure, the method comprising:
    providing a mandrel pattern overlying a dielectric layer, wherein the mandrel pattern comprises amorphous silicon;
    conformally depositing a metal onto the mandrel pattern;
    etching back a portion of the metal to the mandrel pattern to form metal spacers on sidewalls of the mandrel pattern;
    removing the mandrel pattern to define a plurality of metal lines from the metal spacers;
    lithographically defining a final metal pattern from the plurality of metal lines;
    depositing a dielectric layer and forming a least one airgap between one or more adjacent metal lines;
    depositing an ultra-low k dielectric layer;
    planarizing the ultra-low k dielectric layer;
    applying a single damascene process to form a via opening self-aligned to one or more of the metal lines; and
    filling the via opening with a metal to form an electrical connection with the one or more metal lines.

9. The method of claim 8, wherein the sidewall spacers and the filled via opening comprise cobalt, ruthenium, tantalum, tungsten, aluminum, rhodium, platinum, nickel, silver, gold, or combinations thereof.

10. The method of claim 8, wherein the sidewall spacers and the metal lines comprise cobalt.

11. The method of claim 8, wherein the ultra-low k dielectric has a k constant of less than 3.0.

12. The method of claim 8, wherein the ultra-low k dielectric comprises porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof.

* * * * *